United States Patent
Cheng et al.

(10) Patent No.: US 9,502,243 B2
(45) Date of Patent: Nov. 22, 2016

(54) MULTI-ORIENTATION SOI SUBSTRATES FOR CO-INTEGRATION OF DIFFERENT CONDUCTIVITY TYPE SEMICONDUCTOR DEVICES

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/579,430

(22) Filed: Dec. 22, 2014

(65) Prior Publication Data

US 2016/0181276 A1  Jun. 23, 2016

(51) Int. Cl.
| | |
|---|---|
| *H01L 21/02* | (2006.01) |
| *H01L 27/12* | (2006.01) |
| *H01L 21/283* | (2006.01) |
| *H01L 21/84* | (2006.01) |
| *H01L 29/51* | (2006.01) |
| *H01L 29/66* | (2006.01) |
| *H01L 29/78* | (2006.01) |
| *H01L 21/20* | (2006.01) |

(52) U.S. Cl.
CPC ... *H01L 21/02609* (2013.01); *H01L 21/02433* (2013.01); *H01L 21/02488* (2013.01); *H01L 21/20* (2013.01); *H01L 21/283* (2013.01); *H01L 21/84* (2013.01); *H01L 27/1203* (2013.01); *H01L 29/517* (2013.01); *H01L 29/66795* (2013.01); *H01L 29/785* (2013.01)

(58) Field of Classification Search
CPC ............... H01L 21/20; H01L 21/045; H01L 21/02609; H01L 21/02433; H01L 21/02488
See application file for complete search history.

(56) References Cited

U.S. PATENT DOCUMENTS

| | | |
|---|---|---|
| 6,610,548 B1 | 8/2003 | Ami et al. |
| 6,852,575 B2 | 2/2005 | Bojarczuk, Jr. et al. |

(Continued)

OTHER PUBLICATIONS

Doris, B. et al., "A Simplified Hybrid Orientation Technology (SHOT) for High Performance CMOS," 2004 Symposium on VLSI Technology Digest of Technical Papers. (2 Pages).

*Primary Examiner* — Ha Tran T Nguyen
*Assistant Examiner* — Aaron Dehne
(74) *Attorney, Agent, or Firm* — Tutunjian & Bitetto, P.C.; Kenneth R. Corsello

(57) ABSTRACT

A method of forming a semiconductor device that includes providing a base semiconductor substrate having a first orientation crystal plane, and forming an epitaxial oxide layer on the base semiconductor substrate. The epitaxial oxide layer has the first orientation crystal plane. A first semiconductor layer having a second orientation crystal plane is then bonded to the epitaxial oxide layer. A portion of the first semiconductor layer is removed to expose a second surface of the epitaxial oxide layer. A remaining portion of the first semiconductor layer is present on the first surface of the epitaxial oxide layer; and epitaxially forming a second semiconductor layer on the second surface of the epitaxial oxide layer, wherein the second semiconductor layer has a first orientation crystal plane.

20 Claims, 4 Drawing Sheets

(56) References Cited

U.S. PATENT DOCUMENTS

| | | |
|---|---|---|
| 7,135,699 B1 | 11/2006 | Atanackovic |
| 7,199,451 B2 | 4/2007 | Kelman |
| 7,393,733 B2 | 7/2008 | Currie |
| 7,432,569 B1 | 10/2008 | Atanackovic |
| 7,803,670 B2 | 9/2010 | White et al. |
| 8,106,381 B2 | 1/2012 | Atanackovic |
| 8,853,781 B2 | 10/2014 | Cheng et al. |
| 2006/0113605 A1* | 6/2006 | Currie ............. H01L 21/823807 257/368 |
| 2008/0128813 A1* | 6/2008 | Mizushima ....... H01L 21/76256 257/351 |
| 2009/0302482 A1* | 12/2009 | Wang ................ H01L 21/02381 257/776 |
| 2011/0309446 A1* | 12/2011 | Doris ...................... H01L 21/84 257/351 |

\* cited by examiner

MULTI-ORIENTATION SOI SUBSTRATES FOR CO-INTEGRATION OF DIFFERENT CONDUCTIVITY TYPE SEMICONDUCTOR DEVICES

BACKGROUND

Technical Field

The present disclosure relates generally to semiconductor fabrication, and more particularly to structures and methods for forming hybrid substrate structures and related devices.

Description of the Related Art

With the continuing trend towards miniaturization of integrated circuits (ICs), there is a need for transistors to have higher drive currents with increasingly smaller dimensions. Transistors are semiconductor devices that may be classified into NMOS transistors using electrons as carriers, and PMOS transistors using holes as carriers. It is known that electrons have a higher mobility when traveling normal to the <100> crystallographic orientation, while the holes have a higher mobility when traveling normal to the <110> crystallographic orientation.

SUMMARY

In one aspect of the present disclosure, a semiconductor device is provided that includes a base substrate comprised of a semiconductor material having a first orientation crystal plane, and an epitaxial oxide layer present directly on the base substrate and having the first orientation crystal plane. At least one semiconductor on insulator layer (SOI) is present on the epitaxial oxide layer. A first semiconductor layer of the at least one SOI layer that has a second orientation crystal plane that is different from the first orientation crystal plane is present directly on a first portion of the epitaxial oxide layer having the first orientation crystal plane. The first semiconductor layer providing at least the channel region of first conductivity semiconductor device. A second semiconductor layer of the at least one SOI layer is present directly on a second portion of the epitaxial oxide layer and has the first orientation crystal plane. The second semiconductor layer provides at least the channel region of second conductivity semiconductor device.

In one embodiment, a semiconductor device is provided that includes a semiconductor on insulator (SOI) substrate arrangement. The base substrate of the SOI substrate arrangement may be composed of a semiconductor material having a (100) orientation crystal plane, and an epitaxial oxide layer may be present directly on the base substrate and may have a (100) orientation crystal plane. At least one semiconductor on insulator layer (SOI) present on the epitaxial oxide layer. A first semiconductor layer of the at least one SOI layer having a (110) orientation crystal plane may be present directly on a first portion of the epitaxial oxide layer. The first semiconductor layer may provide at least the channel region of a p-type conductivity semiconductor device. A second semiconductor layer having a (100) orientation crystal plane of the at least one SOI layer is present directly on a second portion of the epitaxial oxide layer. The second semiconductor layer provides at least the channel region of an n-type conductivity semiconductor device.

In another embodiment of the present disclosure, a semiconductor device is provided that includes a semiconductor on insulator (SOI) substrate arrangement. The base substrate of the SOI substrate arrangement may be composed of a semiconductor material having a (110) orientation crystal plane. An epitaxial oxide layer may be present directly on the base substrate and may have a (110) orientation crystal plane. At least one semiconductor on insulator layer (SOI) is present on the epitaxial oxide layer. A first semiconductor layer of the at least one SOI layer having a (110) orientation crystal plane can be present directly on a first portion of the epitaxial oxide layer. The first semiconductor layer provides at least the channel region of a p-type conductivity semiconductor device. A second semiconductor layer of the at least one SOI layer is present directly on a second portion of the epitaxial oxide and has a (100) orientation crystal plane. The second semiconductor layer provides at least the channel region of an n-type conductivity semiconductor device.

In another aspect of the present disclosure, a method of forming a semiconductor device is provided that includes providing a base semiconductor substrate having a first orientation crystal plane and forming an epitaxial oxide layer on base semiconductor substrate, wherein the epitaxial oxide layer has the first orientation crystal plane. In a following process, a first semiconductor layer having a second orientation crystal plane is bonded to the epitaxial oxide layer. A portion of the first semiconductor layer is then removed to expose a second surface of the epitaxial oxide layer, wherein a remaining portion of the first semiconductor layer is present on the first surface of the epitaxial oxide layer. A second semiconductor layer is then epitaxially grown on the second surface of the epitaxial oxide layer. The second semiconductor layer has a first orientation crystal plane.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
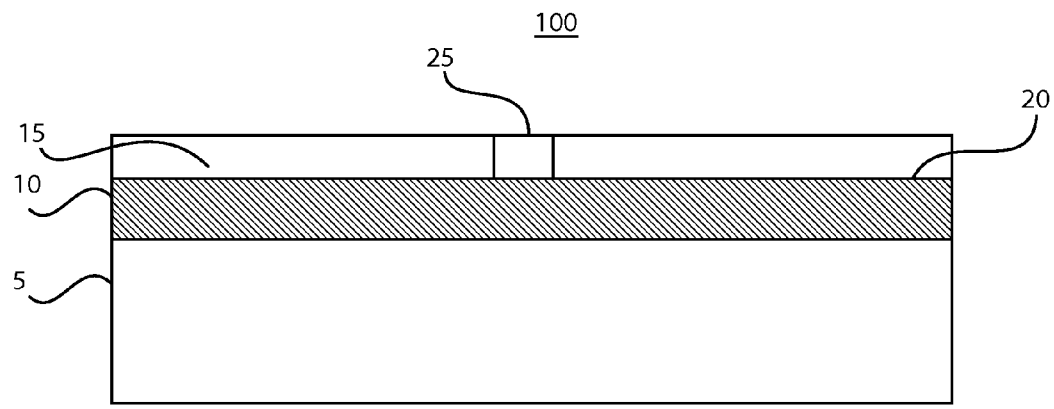
FIG. 1 is a side cross-sectional view of a substrate structure that includes a base substrate of a semiconductor material having a (100) orientation crystal plane, an epitaxial oxide layer having a (100) orientation crystal plane present directly on the base substrate, a first semiconductor layer having a (110) orientation crystal plane present on a first portion of the epitaxial oxide layer, and a second semiconductor layer having a (100) crystal plane present on a second portion of the epitaxial oxide layer, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide hybrid substrates that include two semiconductor surfaces providing different crystalline plane orientations. Prior methods of forming hybrid substrates on semiconductor on insulator (SOI) substrates remove a portion of the SOI layer, and then form an opening through the buried oxide layer to expose a surface of the base semiconductor substrate. The exposed surface of the base semiconductor substrate is then used as an epitaxial growth surface, in which lateral overgrowth is used to provide a semiconductor surface having a different crystalline orientation than a remaining portion of the SOI layer. The remaining portion of the SOI layer and the epitaxially grown material are then used as surfaces for forming semiconductor devices. It has been determined that this method results in the formation of stacking defaults in the lateral overgrowth portion of the epitaxially grown material. The stacking faults can disadvantageously impact the performance of any semiconductor device formed on the lateral overgrowth portion of the epitaxial material.

As will be discussed in greater detail below, it has been determined that in some embodiments the stacking faults produced by the above described method can be eliminated by employing an epitaxial oxide material as the growth surface for a first crystalline orientation semiconductor material (hereafter referred to as a second semiconductor layer) on a substrate that includes another crystalline orientation semiconductor material (hereafter referred to as a first semiconductor layer) that has been bonded to the substrate structure. In some embodiments, the first and second semiconductor layers are then employed to form semiconductor devices, such as fin field effect transistors (FinFETs) and planar semiconductor devices, e.g., partially depleted semiconductor on insulator (PDSOI) semiconductor devices and extremely thin semiconductor on insulator (ETSOI) semiconductor devices.

A "field effect transistor (FET)" is a semiconductor device in which the output current, i.e., source-drain current, is controlled by the voltage applied to the gate. A FET has three terminals, i.e., gate structure, source region and drain region. A gate structure is a structure used to control output current (i.e., flow of carriers in the channel) of a semiconducting device through electrical fields. A FinFET is a field effect transistor in which at least the channel portion of the field effect transistor is present in a fin structure. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The channel is the region underlying the gate structure and between the source and drain region of a semiconductor device that becomes conductive when the semiconductor device is turned on.

The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. The planar device may be formed on what is referred to as being an ETSOI substrate. An "ETSOI substrate" is a semiconductor on insulator (SOI) substrate, in which the semiconductor on insulator (SOI) layer, i.e., the semiconductor layer that provides the channel of the device, has a thickness of 10 nm or less. A semiconductor device having a channel region that is present in an ETSOI substrate typically fully depletes as the device is switched on. As used herein, the term "partially depleted semiconductor on insulator (PDSOI)" denotes a semiconductor device when the channel has a greater thickness than an ETSOI device, in which the channel partially depletes when the device is turned on.

The methods and structures of the present disclosure are now discussed with more detail referring to FIGS. 1-8.

FIG. 1 depicts one embodiment of a substrate structure 100 that includes a base substrate 5 of a semiconductor material having a (100) orientation crystal plane, and an epitaxial oxide layer 10 having a (100) orientation crystal plane present directly on the base substrate 5. The substrate structure 100 also includes a first semiconductor layer 15 having a (110) orientation crystal plane present on a first portion of the epitaxial oxide layer 10, and a second semiconductor layer 20 having a (100) crystal plane present on a second portion of the epitaxial oxide layer 10. The symbol "( )", such as (100) and (110), denotes a particular plane in a crystal structure. The symbol "< >", such as <100> and <110>, denote a family of crystalline directions.

The base substrate 5 may comprise at least one of Si, Ge, SiGe alloys, SiGe:C, SiC, Si:C, GaAs, InAs, InP, as well as other III/V or II/VI compound semiconductors. The base substrate 5 may polycrystalline or monocrystalline. The base substrate 5 may have a thickness ranging from 50 µm (nm, that will not be feasible, the substrate is several to 1000 microns (=1 mm), or thicker. →Better: The thickness of the base substrate 5 of the SOI substrate is inconsequential to the present application.

The epitaxial oxide layer 10 is present in direct contact with the base substrate 5, and is in an epitaxial relationship with the base substrate 5. The term "epitaxial" denotes that a material is formed using an epitaxial growth process. The terms "epitaxial growth and/or deposition" and "epitaxially formed" mean the growth of a material, such as a semiconductor or dielectric, on a deposition surface of a semiconductor material, in which the material being grown has the same crystalline characteristics, e.g., crystalline plane orientation, as the semiconductor material of the deposition surface. For example, as depicted in FIG. 1, the epitaxial oxide layer 10 has the same orientation crystal plane as the base substrate 5. More specifically, as depicted in FIG. 1, both the epitaxial oxide layer 10 and the base substrate 5 may have the orientation of a (100) crystal plane. In other embodiments, both the epitaxial oxide layer 10 and the base substrate 5 may have the orientation of a (110) crystal plane. The epitaxial oxide layer 10 may also be lattice matched to the base substrate 5. By lattice matched it is meant that the material of the epitaxial oxide layer 10 and the base substrate 5 have substantially the same lattice dimension.

The epitaxial oxide layer 10 is typically composed of composition including a rare earth metal and oxygen. In some embodiments, the rare earth metal of the epitaxial oxide layer 10 is selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof.

Exemplary epitaxial oxide materials suitable for the epitaxial oxide layer 10 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the epitaxial oxide layer 10 includes combinations of rare earth oxides (e.g., a material such as $ABO_3$, where 'A' and 'B' may be any rare earth metal (e.g., lanthanum scandium oxide ($LaScO_3$)). In yet another embodiment, epitaxial oxide layer 10 may include aluminum oxide $Al_2O_3$ or aluminum oxide compounds (e.g., lanthanum aluminum $LaAlO_3$). In some examples, the epitaxial oxide layer 10 is selected from the group consisting of $(La_xY_{1-x})_2O_3$, $CeO_2$, and combinations thereof. It is understood that the descriptions of crystalline oxide layers provided herein are for illustrative purposes, and that other crystalline oxide layers or layer combinations may be used in accordance with other embodiments.

The thickness of the epitaxial oxide layer 10 may range from 10 nm to 150 nm. In other embodiments, the thickness of the epitaxial oxide layer 10 may range from 50 nm to 100 nm. The epitaxial oxide layer 10 may be continuous laterally across the width of the substrate structure having no breaks therein.

The first semiconductor layer 15 and the second semiconductor layer 10 are present directly on the epitaxial layer 10. For example, the first semiconductor layer 15 may be present on a first surface of the epitaxial layer 10, and the second semiconductor layer 20 may be present on a second surface of the epitaxial layer 10, wherein the first and second semiconductor layers 15, 20 are adjacent to one another in the substrate structure. In some embodiments, the first and second semiconductor layers 15, 20 may be separated from one another by an insolation region 25, such as a shallow trench isolation (STI) region.

The first semiconductor layer 15 typically has an orientation, i.e., crystal plane orientation, which is different from the orientation, i.e., crystal plane orientation, of the second semiconductor layer 20, the epitaxial oxide layer 10, and the base substrate 5. For example, when the epitaxial oxide layer 10, the base substrate 5, and the second semiconductor layer 20 has a (100) crystal plane orientation, the first semiconductor layer 15 may have a (110) crystal plane orientation. In another example, when the epitaxial oxide layer 10, the base substrate 5 and the second semiconductor layer 20 has a (110) crystal plane orientation, the first semiconductor layer 15 may have a (100) crystal plane orientation.

The first semiconductor layer 15 is typically engaged to the first surface of the epitaxial oxide layer 10 by a bonded interface, which may be provided by a thermal bond, adhesive bond, or a combination thereof. The interface between the first semiconductor layer 15 and the epitaxial layer 10 may be characterized by a lattice mismatch. The first semiconductor layer 15 may be totally relaxed. The first semiconductor layer 15 may comprise at least one of Si, Ge, SiGe alloys, SiGe:C, SiC, Si:C, GaAs, InAs, InP, as well as other III/V or II/VI compound semiconductors. The first semiconductor layer 15 may be polycrystalline or monocrystalline. In one example, the first semiconductor layer 15 may have a thickness ranging from 5 nm to 100 nm. In another example, the first semiconductor layer 15 may have a thickness ranging from 25 nm to 50 nm.

The second semiconductor layer 20 is typically composed of an epitaxial material that is in an epitaxial relationship with the second surface of the epitaxial oxide layer 10. Therefore, the second semiconductor layer 20 typically has an orientation, i.e., crystal plane orientation, that is the same as the orientation, i.e., crystal plane orientation, of the epitaxial oxide layer 10, which may also the same as the base substrate 5. For example, when the epitaxial oxide layer 10 has a (100) crystal plane orientation, the second semiconductor layer 20 may have a (100) crystal plane orientation. In another example, when the epitaxial oxide layer 10 has a (110) crystal plane orientation, the second semiconductor layer 20 may have a (110) crystal plane orientation. The crystalline orientation of the second semiconductor layer 20 is different from the crystalline orientation of the first semiconductor layer 15 to provide a hybrid substrate. The epitaxial oxide layer 10 may also be lattice matched to the base substrate 5. Therefore, depending upon the compositions of the epitaxial oxide layer 10 and the second semiconductor layer 20 and their natural lattice dimensions, in some embodiments, the second semiconductor layer 20 may be in a tensile or compressive state.

The second semiconductor layer 20 may comprise at least one of Si, Ge, SiGe alloys, SiGe:C, SiC, Si:C, GaAs, InAs, InP, as well as other III/V or II/VI compound semiconductors. The second semiconductor layer 20 may be polycrystalline or monocrystalline. In one example, the second semiconductor layer 20 may have a thickness ranging from 5 nm to 100 nm. In another embodiment, the second semiconductor layer 20 may have a thickness ranging from 25 nm to 50 nm.

In some embodiments, the first and second semiconductor layers 15, 20 are substantially free stacking defaults. The substrate structure depicted in FIG. 1 may provide a substrate for forming semiconductor devices.

Figure 2:
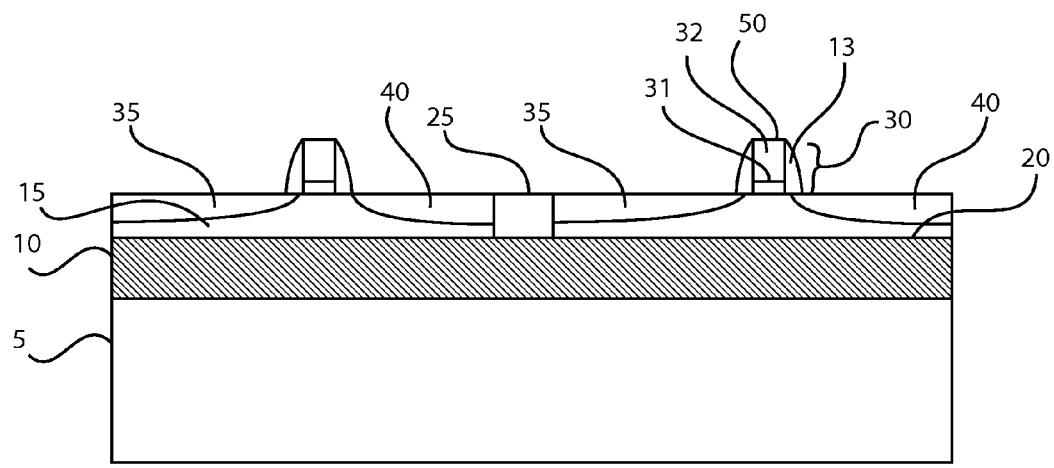
FIG. 2 is a side cross-sectional view of a planar semiconductor device that is formed on the substrate structure depicted in FIG. 1, in accordance with one embodiment of the present disclosure.

FIG. 2 depicts one embodiment of planar semiconductor devices that are formed on the substrate structure 100 that is depicted in FIG. 1. In some embodiments, each semiconductor device 50a, 50b includes a gate structure 30 that is formed on the upper surface of the first and/or second semiconductor layer 15, 20, and a source region 35 and a drain region 40 that are formed within the first and/or second semiconductor layer 15, 20. The "gate structure" functions to switch the semiconductor device from an "on" to "off" state, and vice versa. As used herein, the term "drain region"

means a doped region in semiconductor device located at the end of the channel, in which carriers are flowing out of the transistor through the drain. As used herein, the term "source region" is a doped region in the semiconductor device, in which majority carriers are flowing into the channel.

The gate structure 30 typically includes at least one gate dielectric layer 31 and at least one gate conductor layer 32. In one embodiment, the at least one gate dielectric layer 31 employed in the present disclosure includes, but is not limited to, an oxide, nitride, oxynitride and/or silicates including metal silicates, aluminates, titanates and nitrides. In one example, when the at least one gate dielectric layer 31 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 31 may vary, but typically, the at least one gate dielectric layer 51 has a thickness from 1 nm to 10 nm. In another embodiment, the at least one gate dielectric layer 51 has a thickness from 1 nm to 3 nm. The conductive material that provides the at least one gate conductor layer 32 may comprise polysilicon, SiGe, a silicide, a metal or a metal-silicon-nitride such as Ta—Si—N. Examples of metals that can be used as the conductive material for the at least one gate conductor include, but are not limited to, Al, W, Cu, and Ti or other like conductive metals.

The source region 35 and the drain region 40 is formed in portions of the first and second semiconductor layer 15, 20 on opposing sides of the gate structure 30. Typically, the conductivity type of the source and drain regions 35, 40 dictates the conductivity type of the device. For example, if the source and rain regions 35, 40 of the semiconductor devices are doped to a p-type conductivity, the semiconductor device may be a p-type semiconductor device.

Referring to FIG. 2, in some embodiments, in which the first semiconductor layer 15 has a (110) crystal orientation plane, and the second semiconductor layer 20 has a (100) crystal plane orientation, the semiconductor devices formed on the first semiconductor layer 15 may have a p-type conductivity, and the semiconductor devices formed on the second semiconductor layer 20 may have an n-type conductivity. As used herein, "p-type" refers to the addition of impurities to an intrinsic semiconductor that creates deficiencies of valence electrons. The p-type conductivity semiconductor devices are typically produced within silicon containing materials by doping the source and drain regions with elements from group III-A of the Periodic Table of Elements. In a silicon-containing fin structure, examples of p-type dopants, i.e., impurities, include but are not limited to boron, aluminum, gallium and indium. As used herein, "n-type" refers to the addition of impurities that contributes free electrons to an intrinsic semiconductor. N-type conductivity semiconductor devices are typically produced within silicon containing material by doping the source and drain regions with elements from group V-A of the Periodic Table of Elements. In a silicon containing fin structure, examples of n-type dopants, i.e., impurities, include but are not limited to, antimony, arsenic and phosphorous.

Although not depicted in the supplied figures, the source and drain regions 35, 40 may include raised source and drain regions of epitaxial material.

In some embodiments, to provide for optimum carrier speed for the n-type semiconductor devices formed on the second semiconductor layer 20 having the (100) crystalline plane orientation, the gate structure 50 and source and drain regions 35, 40 are positioned so that the direction of carrier flow between the source and drain region 35, 40 is parallel to the <100> direction. In some embodiments, to provide for optimum carrier speed for the p-type semiconductor devices formed on the first semiconductor layer 15 having the (110) crystalline plane orientation, the gate structure 50 and the source and drain regions 35, 40 are positioned so that the direction of carrier flow between the source and drain region 35, 40 is parallel to the <110> direction.

In some embodiments, the planar semiconductor devices depicted in FIG. 2 may be extremely thin semiconductor on insulator (ETSOI) semiconductor devices. In these embodiments, the thickness of the first and second semiconductor layers 15, 20 is 10 nm or less. In some examples, the thickness of the channel region in an ETSOI substrate may range from 4 nm to 6 nm. In other embodiments, the planar semiconductor device that is depicted in FIG. 2 may be a partially depleted semiconductor on insulator (PDSOI) device.

It is noted that although FIG. 2 only depicts a single p-type semiconductor device on the first semiconductor layer 15 and a single n-type semiconductor device on the second semiconductor layer 20, any number of semiconductor devices may be formed on the substrate structure 100 that is depicted in FIG. 1.

Figure 3:
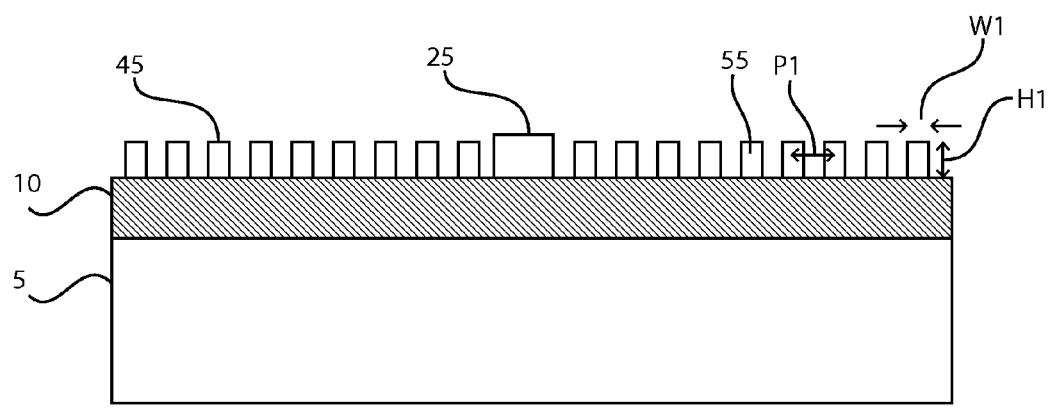
FIG. 3 is a side cross-sectional view of fin structures formed form the substrate structure depicted in FIG. 1 for use in a FinFET semiconductor device, in accordance with one embodiment of the present disclosure.

In some other embodiments, the substrate structure 100 that is depicted in FIG. 1 may also be used to form fin containing semiconductor devices, such as FinFETs. For example, the first semiconductor layer 15 and the second semiconductor layer 20 can be patterned and etched to provide a first plurality of fin structures 45 on the first surface of the epitaxial oxide layer 10 and a second plurality of fin structures 55 on the second surface of the epitaxial oxide layer 10, as depicted in FIG. 3. Similar to the description of the engagement of the first semiconductor layer 15 to the epitaxial oxide layer 10, each fin structure in the first plurality of fin structures 45 may be in a bonded engagement to the epitaxial oxide layer 10. Similar to the description of the engagement of the second semiconductor layer 20 to the epitaxial oxide layer 10. The each fin structure in the first plurality of fin structures 55 may be in an epitaxial relationship with the epitaxial oxide layer 10.

Referring to FIG. 3, each of the fin structures 45, 55 may have a height $H_1$ ranging from 5 nm to 200 nm. In another embodiment, each of the fin structures 45, 55 has a height $H_1$ ranging from 10 nm to 100 nm. In one example, each of the fin structures 45, 55 has a height $H_1$ ranging from 20 nm to 60 nm. Each of the plurality of fin structures 45, 55 may have a width $W_1$ of less than 20 nm. In another embodiment, each of the fin structures 45, 55 has a width $W_1$ ranging from 3 nm to 12 nm. Although eighteen fin structures 45, 55 are depicted in FIG. 2, the present disclosure is not limited to only this example. It is noted that any number of fin structures 45, 55 may be formed from the semiconductor substrate 5. The pitch P1 separating adjacent fin structures 45, 55 may range from 10 nm to 60 nm. In another example, the pitch P1 separating adjacent fin structures 45, 55 may range from 20 nm to 50 nm.

Figure 4:
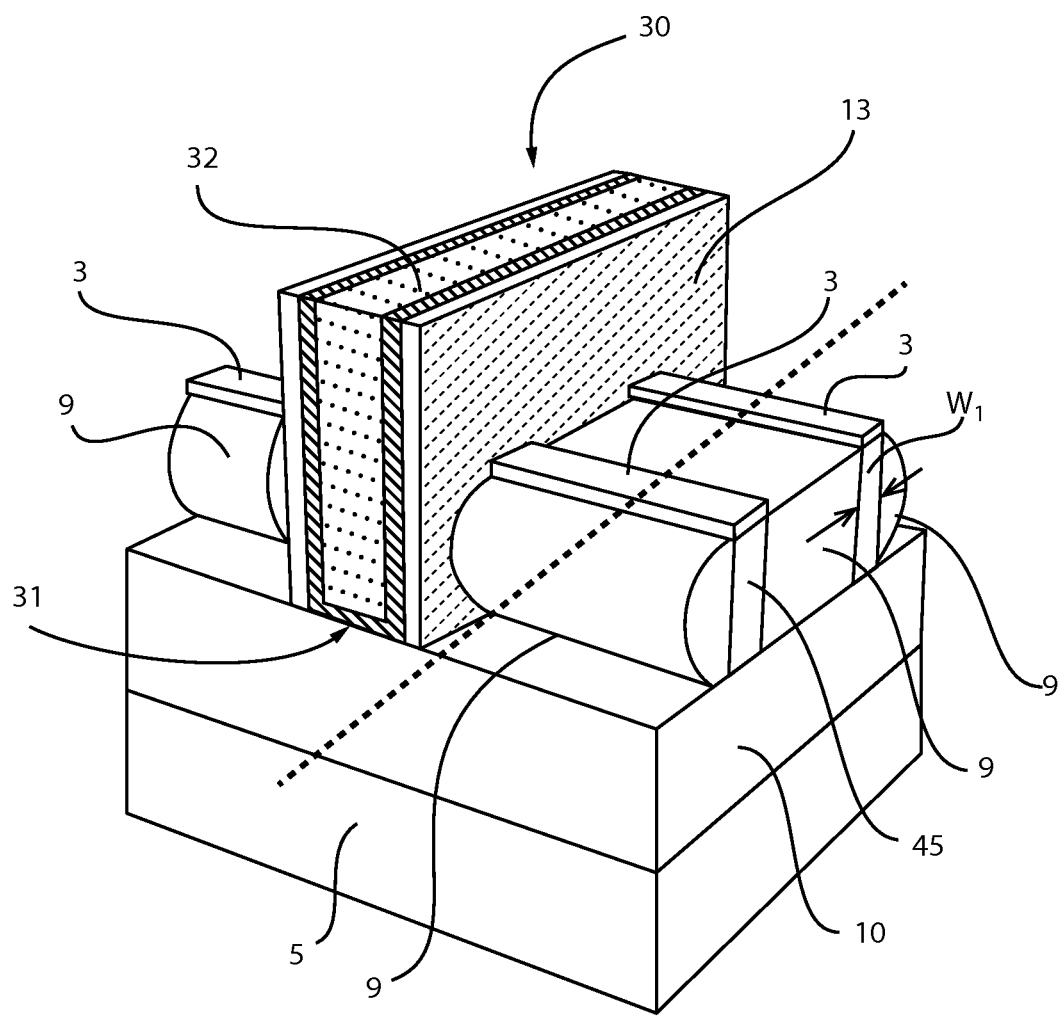
FIG. 4 is a perspective view of a FinFET semiconductor device, in accordance with the present disclosure.

FIG. 4 depicts one embodiment of the gate structure 30 and source and drain region structures 9 that may be formed on the fin structures 45' to provide FinFET structures. FIG. 4 depicts a set of fin structures 45'. The set of fin structures 45' depicted in FIG. 4 may be provided by any set of fin structures from plurality of fin structures 45, 55 that are depicted in FIG. 3. For example, when the fin structures 45' depicted in FIG. 4 are present on the first surface of the epitaxial layer 10, the fin structures 45' may be engaged to the epitaxial oxide layer 10 by a bonded engagement, wherein the material that provides the fin structures 45' has a different crystalline plane orientation than the crystalline plane orientation of the epitaxial oxide layer 10. For example, the fin structures 45' composed of the first semiconductor layer may have a (110) crystalline plane orientation, and the epitaxial oxide layer 10 may have a (100) crystalline plane orientation.

In another example, when the fin structures 45' depicted in FIG. 4 are formed on the second surface of the epitaxial oxide layer 10, the fin structures 45' may be in an epitaxially formed arrangement with the epitaxial oxide layer 10, wherein the material that provides the fin structures 45' has the same crystalline plane orientation as the crystalline plane orientation of the epitaxial oxide layer 10. For example, the fin structures 45' composed of the second semiconductor layer may have a (100) crystalline plane orientation, and the epitaxial oxide layer 10 may have a (100) crystalline plane orientation.

The gate structure 30 may be formed on a channel portion of the fin structure 45'. The gate structure depicted in FIG. 4 is similar to the gate structure 30 that is depicted in FIG. 2, and includes a gate dielectric layer 31 that is present on the sidewall and upper surface portions of the channel region of the fin structures 45'. A gate conductor layer 32 is present on the gate dielectric layer 31. The above description of the compositions for the gate conductor layer 32 and the gate dielectric layer 31 of the planar semiconductor device depicted in FIG. 2 is suitable for the description of the composition for the gate conductor layer 32 and the gate dielectric layer 31 that is depicted in FIG. 4. FIG. 4 also depicts source and drain regions 9. The source and drain regions 9 depicted in FIG. 4 are merged epitaxial source and drain regions, which are n-type or p-type doped similar to the source and drain region 35, 40 depicted in FIG. 2. The merged epitaxial source and drain regions 9 may be composed of a type IV semiconductor material, such as silicon, silicon germanium, germanium, silicon doped with carbon, silicon germanium doped with carbon or a combination thereof. In some embodiments, the source and drain regions 9 may be doped to a p-type conductivity for the plurality of fin structures 45 composed of the material from the first semiconductor layer 15, and the source and drain region 9 may be doped to an n-type conductivity for the plurality of fin structures 55 composed of the material of the second semiconductor layer 20.

As indicated above in FIG. 3, by providing fin structures 45, 55 composed of different crystalline orientation materials on the same substrate structure, a hybrid substrate structure has been provided for FinFET semiconductor devices. In some embodiments, to provide for optimum carrier speed for the n-type FinFET devices formed on the second semiconductor layer 20 having the (100) crystalline plane orientation, the gate structure 30 and source and drain regions 9 are positioned so that the direction of carrier flow between the source and drain region 9 across the channel is parallel to the <100> direction. In some embodiments, to provide for optimum carrier speed for the p-type FinFET devices formed on the first semiconductor layer having the (110) crystalline plane orientation, the gate structure 30 and the source and drain regions 9 are positioned so that the direction of carrier flow between the source and drain region 9 across the channel is parallel to the <110> direction.

It is noted that the planar semiconductor devices, e.g., FETs, ETSOI semiconductor devices, PDSOI semiconductor devices, and the FinFETs that are described above are only some examples of semiconductor devices that may be formed on the substrate structure 100 that is depicted in FIG. 1. Other types of semiconductor devices are equally applicable for being formed on the substrate structure 100 that is depicted in FIG. 1, such as planar devices, like CMOS, HBT's, III-V HEMT's and combinations thereof.

Figure 5:
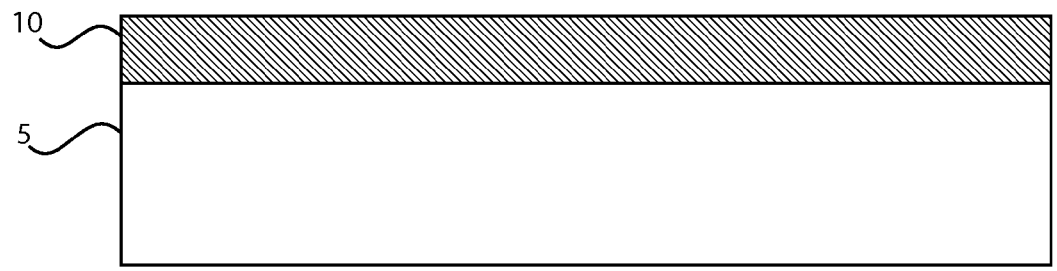
FIG. 5 is a side cross-sectional view depicting forming an epitaxial oxide layer on the base substrate that is depicted in FIG. 4, in accordance with one embodiment of the present disclosure.

FIG. 5 depicting one embodiment of forming an epitaxial oxide layer 10 on the base substrate 5 that is depicted in FIG. 4. The base substrate 5 has been described above with reference to FIG. 1. The epitaxial oxide layer 10 is formed using an epitaxial deposition process, and has a crystalline crystal structure, such as a monocrystalline crystal structure. The epitaxial oxide layer 10 is typically composed of a rare earth metal oxide. As defined by International Union of Pure and Applied Chemistry (IUPAC), a rare earth element (REE) or rare earth metal is one of a set of seventeen chemical elements in the periodic table, specifically the fifteen lanthanides, plus scandium and yttrium. More specifically, in some embodiments, the epitaxial oxide layer 10 is an oxide including a rare earth metal selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof.

Exemplary epitaxial oxide materials for the epitaxial oxide layer 10 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the epitaxial oxide layer 10 includes combinations of rare earth oxides (e.g., a material such as $ABO_3$, where 'A' and 'B' may be any rare earth metal (e.g., lanthanum scandium oxide ($LaScO_3$)). In yet another embodiment, the c epitaxial oxide layer 10 may include aluminum oxide $Al_2O_3$ or aluminum oxide compounds (e.g., lanthanum aluminum $LaAlO_3$). In some other examples, the epitaxial oxide layer 10 may be $(La_xY_{1-x})_2O_3$, $YBa_2Cu_3O_7$, $Bi_mSr_2Ca_{n-1}$, $Cu_nO_{2n+m+2}$, $CeO_2$, $SrBi_2Ta_2O_9$, $Nb_2O_5$—$SiO_2$—$Na_2O$—$Ba_2O_3$—$TiO_2$ and combinations thereof. It is understood that the descriptions of crystalline oxide layers provided herein are for illustrative purposes, and that other crystalline oxide layers or layer combinations may be used in accordance with other embodiments.

The epitaxial oxide layer 10 may be formed using a deposition process that provides a crystalline crystal structure, in which the deposited oxide has the same crystal plane orientation of the deposition surface, e.g., base substrate 5. In some examples, when the base substrate 5 has a (100) crystal plane orientation, the epitaxial oxide layer 10 is deposited to have a (100) crystal plane orientation. In another example, when the base substrate 5 has a (110) crystal plane orientation, the epitaxial oxide layer 10 is deposited to have a (110) crystal plane orientation. Deposition methods for forming the epitaxial oxide layer 10 may include pulsed laser ablation; molecular beam epitaxial (MBE) deposition; chemical vapor deposition (CVD), such as metallo-organic chemical vapor deposition (MOCVD) and plasma enhanced MOCVD (PE-MOCVD); liquid phase epitaxy (LPE); and combinations thereof.

U.S. Pat. No. 6,852,575 titled "Method of forming lattice-matched structure on silicon and structure formed thereby", which is incorporated herein by reference in its entirety, provides one example of how to form an epitaxial oxide layer 10 of $(La_xY_{1-x})_2O_3$ on a silicon containing deposition surface, such as the base substrate 5. U.S. Pat. No. 6,610,548 titled "Crystal growth method of oxide, cerium oxide, promethium oxide, multi-layered structure of oxides, manufacturing method of field effect transistor, manufacturing method of ferroelectric non-volatile memory and ferroelectric non-volatile memory", which is incorporated herein by reference in its entirety, provides one example of how to form an epitaxial oxide layer 10 of $CeO_2$ on a silicon containing deposition surface, such as the base substrate 5. U.S. Pat. No. 7,135,699 titled "Method and apparatus for growth of single-crystal rare-earth oxides, nitrides, and phosphides", which is incorporated herein by reference in its entirety, provides some other example of how to form epitaxial oxide layers 10 on a silicon containing deposition surface, such as the base substrate 5.

Referring to FIG. 5, the epitaxial oxide layer 10 may be formed continuously along the entire width of the upper surface of the base substrate 5.

It is noted that the above examples for forming the epitaxial oxide layer 10 are provided for illustrative purposes only, and are not intended to limit the present disclosure. Other deposition processes have also been contemplated so long as the deposition process provides a dielectric material have the same crystalline orientation as the deposition surface, i.e., base substrate 5.

Figure 6:
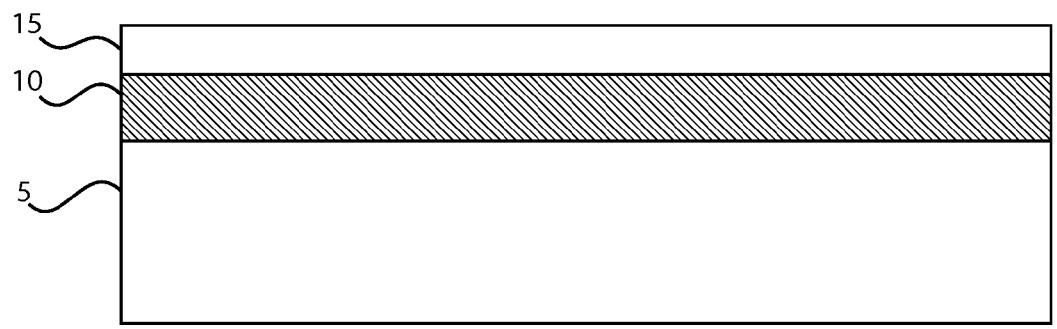
FIG. 6 is a side cross-sectional view depicting bonding a first semiconductor layer to the epitaxial oxide layer that is depicted in FIG. 5, in accordance with one embodiment of the present disclosure.

FIG. 6 depicts one embodiment of bonding a first semiconductor layer 15 to the epitaxial oxide layer 10 that is depicted in FIG. 5. The first semiconductor layer 15 may have a crystalline crystal structure, e.g., a monocrystalline crystal structure. The first semiconductor layer 15 has a crystalline orientation that is different from the crystalline orientation of the epitaxial oxide layer 10, and therefore has a different crystalline orientation than the base substrate 5. The first semiconductor layer 15 is applied to the epitaxial oxide layer 10 by a transfer process. The transfer process may include a wafer transfer process (e.g., wafer bonding) and may include cleaving, etching, adhesion or other wafer transfer techniques. The first semiconductor layer 15 may be bonded to the epitaxial oxide layer 10 by contacting the first semiconductor layer 15 to the epitaxial oxide 10 under pressure and elevated temperature to form a thermal bond engaging the first semiconductor layer to the epitaxial oxide layer 10. In other examples, the first semiconductor layer 15 may be bonded to the epitaxial oxide layer 10 using adhesives.

The first semiconductor layer 15 is typically engaged to a handling substrate (not shown) prior to being engaged to the epitaxial oxide layer 10. Following engagement, i.e., thermal bonding or adhesive bonding, of the first semiconductor layer to the epitaxial oxide layer 10, the handling substrate may be removed using a cleaving method, such as spalling or smart cut, etc. In other embodiments, the handling substrate can be removed by epitaxial layer lift-off (ELO). In yet other embodiments, etching process or planarization processes may be used alone or in combination with the above described processes to remove the handling substrate.

Figure 7:
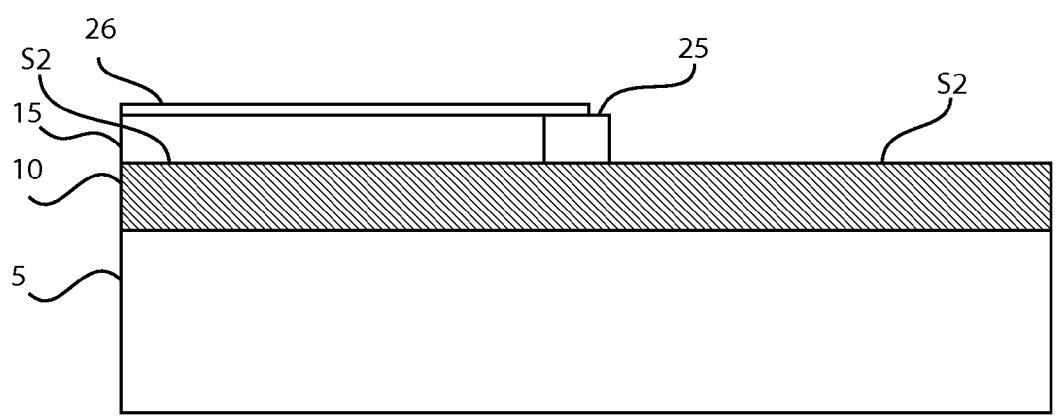
FIG. 7 is a side cross-sectional view depicting removing a portion of the first semiconductor layer to expose a second surface of the epitaxial oxide layer, wherein a remaining portion of the first semiconductor layer is present on the first surface of the epitaxial oxide layer.

FIG. 7 depicting removing a portion of the first semiconductor layer 15 to expose a second surface S2 of the epitaxial oxide layer 10, wherein a remaining portion of the first semiconductor layer 15 is present on a first surface Si of the epitaxial oxide layer 10. In some embodiments, prior to removing a portion of the first semiconductor layer 15, an isolation region 25 is formed through the first semiconductor layer 15, which can define the surfaces of the epitaxial oxide layer 10 that provide the first surface Si of the epitaxial oxide layer 10 and the second surface S2 of the epitaxial oxide layer 10. The isolation region 25 may be formed by etching a trench in the first semiconductor layer 15, and filling the trench with a dielectric material using a deposition process, such as chemical vapor deposition (CVD). In some embodiments, the isolation region 25 may be composed of an oxide, e.g., silicon oxide, or a nitride, e.g., silicon nitride.

In some embodiments, removing the portion of the first semiconductor layer 15 may begin with forming a block mask 26 (also referred to as etch mask) of the portion of the first semiconductor layer 15 that is present on the first surface Si of the epitaxial oxide layer 10. The block mask 26 may be composed of photoresist material or may be composed of a dielectric material, such as silicon nitride or silicon oxide. The composition of the block mask is selected so that the exposed portion of the first semiconductor layer 15 may be etched with an etch process that is selective to the block mask 26. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

To provide the photoresist mask, i.e., a block mask 26 composed of a photoresist material, a photoresist layer is first positioned on the first semiconductor layer 15. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

To provide a block mask composed of a dielectric material, e.g., a hard mask composed of silicon nitride, a dielectric material layer is formed on the first semiconductor layer 15 prior to forming a photoresist mask (as described above), wherein the photoresist mask is used to etch the dielectric material layer. The remaining portion of the dielectric material provides the hard mask.

Following the formation of the block mask 26, an etching process may remove the unprotected portions of the first semiconductor layer 15, wherein the etching process can be selective to at least one of the block mask 26 and the epitaxial oxide layer 10. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process is terminated upon exposing the second surface S2 of the epitaxial oxide layer 10.

Figure 8:
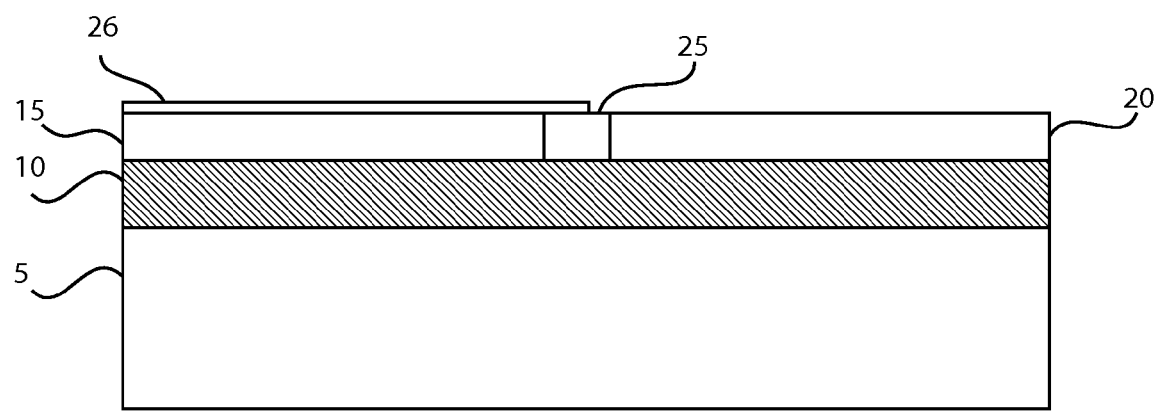
FIG. 8 is a side cross-sectional view depicting epitaxially forming a second semiconductor layer on the second surface of the epitaxial oxide layer, in accordance with one embodiment of the present disclosure.

FIG. 8 depicts epitaxially forming a second semiconductor layer 20 on the second surface S2 of the epitaxial oxide layer 10. Because the second semiconductor layer 20 is formed using an epitaxial deposition process, the second semiconductor layer 20 will have the same crystalline orientation as the deposition surface, on which the second semiconductor material layer 20 is formed. For example, when the epitaxial oxide layer 10 is composed of a material having a (100) crystalline plane orientation, the epitaxially formed second semiconductor layer 20 will also have a (100) crystal plane orientation. In another example, when the epitaxial oxide layer 10 is composed of a material having a (110) crystalline plane orientation, the epitaxially formed second semiconductor layer 20 will also have a (110) crystal plane orientation.

The second semiconductor layer 20 may be formed using an epitaxial deposition process using a chemical vapor deposition apparatus, such as Atmospheric Pressure CVD (APCVD), Low Pressure CVD (LPCVD), Plasma Enhanced CVD (PECVD), Metal-Organic CVD (MOCVD) and combinations thereof. In some embodiments, in which the semiconductor material that provides the second semiconductor layer 20 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that provides the second semiconductor layer 20 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that provides the second semiconductor layer 20 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. It is noted that the epitaxial deposition process may be a selective deposition process.

The second semiconductor layer 20 is an epitaxially formed material that does not include the stacking defaults that result from the above described lateral epitaxial growth processes of prior methods.

The epitaxial material will only be formed on exposed crystalline surfaces, i.e., the exposed portion of the epitaxial oxide layer 10. The epitaxial material will not be formed on non-crystalline surfaces, such as the upper surface of the block mask 26. The block mask 26 may be removed using an etch or chemical stripping process to provide the substrate structure depicted in FIG. 1.

To provide planar semiconductor devices, as depicted in FIG. 2, the gate structures 30 may be formed using deposition, e.g., chemical vapor deposition, and etch processes. The gate structures 30 may be formed using gate first or gate last process sequences. In some embodiments, gate sidewall spacers 13 may be formed on the sidewalls of the gates structures of a dielectric material, e.g., silicon oxide, by using deposition and etch back processes. The source and drain regions 35, 40 may be formed using ion implantation of n-type and p-type dopants, wherein block masks may be employed to specifically select regions of the substrate structure for ion implantation. In the embodiments employing ETSOI substrates, the first and second semiconductor layers 15, 20 may be thinned using planarization and/or etch processes.

To provide the FinFET semiconductor devices, as depicted in FIG. 4, the first and second semiconductor layers 15, 20 may be patterned and etched to provide the fin structures 45, 55 that have been described above with reference to FIG. 3. In some embodiments, prior to etching the first and second semiconductor layers 15, 20 to provide the plurality of fin structures 45, 55, a layer of the dielectric material can deposited atop the upper surface of the first and second semiconductor layers 15, 20 to provide a dielectric fin cap 3. The material layer that provides the dielectric fin cap 3 may be composed of a nitride, oxide, oxynitride material, and/or any other suitable dielectric layer. The dielectric fin cap 3 may be used as an etch mask for forming the first and second fin structures 45, 55. The gate structures 30 may be formed using deposition, e.g., chemical vapor deposition, and etch processes. Similar to the planar semiconductor devices, the gate structures 30 of the FinFET semiconductor devices may also be formed using gate first and gate last process sequences. Gate sidewall spacers 13 may also be formed on the sidewalls of the gate structures 30 to the fin structures 45, 55. In some embodiments, n-type and p-type dopants may be ion implanted into the source and drain portions of the fin structures 45, 55 on opposing sides of the gate structures 30. The source and drain merge structures 9 may be formed using epitaxial deposition, wherein the n-type and p-type dopants of the source and drain merge structures 9 may be introduced using in-situ doping. By "in-situ doping" it is meant that the dopant is added to the base material as the base material is being formed, e.g., epitaxially formed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:
1. A semiconductor device comprising:
a base substrate comprised of a semiconductor material having a first orientation crystal plane;
an epitaxial oxide layer present directly on the base substrate and having the first orientation crystal plane, wherein an entirety of the epitaxial oxide layer has the first orientation crystal plane;
a first semiconductor layer having a second orientation crystal plane that is different from the first orientation crystal plane present directly on a first portion of the epitaxial oxide layer having the first orientation crystal plane, the first semiconductor layer providing at least the channel region of first conductivity semiconductor device; and a second semiconductor layer present directly on a second portion of the epitaxial oxide layer that has the first orientation crystal plane, the second semiconductor layer provides at least the channel region of second conductivity semiconductor device.

2. The semiconductor device of claim 1, wherein the first orientation crystal plane is (100), the second orientation crystal plane is (110), the first conductivity semiconductor device is a p-type semiconductor device, and the second conductivity semiconductor device is an n-type semiconductor device.

3. The semiconductor device of claim 1, wherein the first orientation crystal plane is (110), the second orientation crystal plane is (100), the first conductivity semiconductor device is an n-type semiconductor device, and the second conductivity semiconductor device is a p-type semiconductor device.

4. The semiconductor device of claim 1, wherein the base substrate comprises a silicon containing material selected from the group consisting of Si, SiGe, Ge, Si:C (silicon doped with carbon), SiGe:C, and combinations thereof.

5. The semiconductor device of claim 1, wherein the epitaxial oxide layer is an oxide including a rare earth metal selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof.

6. The semiconductor device of claim 1, wherein the epitaxial oxide layer is selected from the group consisting of $(La_xY_{1-x})_2O_3$, $CeO_2$, and combinations thereof.

7. The semiconductor device of claim 1, wherein the first semiconductor layer is an epitaxial material.

8. The semiconductor device of claim 5, wherein the first semiconductor layer is lattice matched to the epitaxial oxide layer.

9. The semiconductor device of claim 1, wherein the first semiconductor layer comprises a first silicon containing material selected from the group consisting of Si, SiGe, Ge, Si:C (silicon doped with carbon), SiGe:C, and combinations thereof; and the second semiconductor layer comprises a second silicon containing material selected from the group consisting of Si, SiGe, Ge, Si:C (silicon doped with carbon), SiGe:C, and combinations thereof.

10. The semiconductor device of claim 1, wherein an interface between the second semiconductor layer and the epitaxial oxide layer is a bonded interface.

11. The semiconductor device of claim 8, wherein there is a lattice mismatch between the second semiconductor layer and the epitaxial oxide layer.

12. The semiconductor device of claim 2, wherein the first semiconductor layer provides a first fin structure for a p-type FinFET, wherein the first fin structure is orientated so that hole charge carriers travel along a <110> orientation direction, and the second semiconductor layer provides a second fin structure for an n-type FinFET, wherein the second fin structure is orientated so that electron charge carrier travel along a <100> orientation direction.

13. The semiconductor device of claim 1, wherein the first semiconductor layer has a thickness of less than 10 nm to provide the channel of an extremely thin semiconductor on insulator (ETSOI) p-type semiconductor device that is planar, and the second semiconductor layer has a thickness of less than 10 nm to provide the channel of an extremely thin semiconductor on insulator (ETSOI) n-type semiconductor device that is planar.

14. A semiconductor device comprising:
a base substrate comprised of a semiconductor material having a (100) orientation crystal plane;
an epitaxial oxide layer present directly on the base substrate, the epitaxial oxide layer having a (100) orientation crystal plane in its entirety;
a first semiconductor layer having said (110) orientation crystal plane present directly on a first portion of the epitaxial oxide layer having said (100) orientation crystal plane, the first semiconductor layer providing at least the channel region of a p-type conductivity semiconductor device; and
a second semiconductor layer having a (100) orientation crystal plane present directly on a second portion of the epitaxial oxide layer having said (100) orientation crystal plane, the second semiconductor layer provides at least the channel region of an n-type conductivity semiconductor device.

15. A method of forming a semiconductor device comprising:
providing a base semiconductor substrate having a first orientation crystal plane;
forming an epitaxial oxide layer on base semiconductor substrate, wherein an entirety of the epitaxial oxide has the first orientation crystal plane;
bonding a first semiconductor layer having a second orientation crystal plane to the epitaxial oxide layer having the first orientation crystal plane;
removing a portion of the first semiconductor layer to expose a second surface of the epitaxial oxide layer, wherein a remaining portion of the first semiconductor layer is present on the first surface of the epitaxial oxide layer; and
epitaxially forming a second semiconductor layer on the second surface of the epitaxial oxide layer, wherein the second semiconductor layer has a first orientation crystal plane, wherein the remaining portion of the first semiconductor layer provides the channel region of a first conductivity semiconductor device and the second semiconductor layer provides the channel region of a second conductivity semiconductor device.

16. The method of claim 15, wherein the first orientation crystal plane is (110) and the second orientation crystal plane is (100), wherein the first conductivity semiconductor device is a p-type semiconductor device, and the second conductivity semiconductor device is an n-type semiconductor device.

17. The method of claim 15, wherein the epitaxial oxide layer is an oxide including a rare earth metal selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof.

18. The method of claim 15, wherein the first semiconductor layer comprises a first silicon containing material selected from the group consisting of Si, SiGe, Ge, Si:C (silicon doped with carbon), SiGe:C, and combinations thereof and the second semiconductor layer comprises a second silicon containing material selected from the group consisting of Si, SiGe, Ge, Si:C (silicon doped with carbon), SiGe:C, and combinations thereof.

19. The method of claim 15, further comprising:
  etching the first and second semiconductor layers to provide a first set of fin structures composed of material from the first semiconductor layer, and a second set of fin structures composed of material from the second semiconductor layer;
  forming a gate structure on the channel region portions of the first and second set of fin structures; and
  forming source and drain regions in the portions of the first and second fin structures that are present on opposing sides of the gate structure.

20. The method of claim 15 further comprising forming at least one gate structure on the first and second semiconductor layers, and forming source and drain regions in the first and second semiconductor layers on opposing sides of the at least one gate structure to provide at least one planar first conductivity semiconductor device on the first semiconductor layer, and at least one planar second conductivity semiconductor device on the second semiconductor layer.

* * * * *